(12) United States Patent
Kobayashi

(10) Patent No.: US 7,535,169 B2
(45) Date of Patent: May 19, 2009

(54) ORGANIC ELECTROLUMINESCENT DEVICE, METHOD FOR PRODUCING THE SAME, AND ELECTRONIC APPLIANCE

(75) Inventor: Hidekazu Kobayashi, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 552 days.

(21) Appl. No.: 11/046,945

(22) Filed: Feb. 1, 2005

(65) Prior Publication Data
US 2005/0179373 A1 Aug. 18, 2005

(30) Foreign Application Priority Data
Feb. 16, 2004 (JP) .............. 2004-038476
Dec. 6, 2004 (JP) .............. 2004-352326

(51) Int. Cl.
H05B 33/04 (2006.01)
H05B 33/10 (2006.01)
H01J 9/00 (2006.01)

(52) U.S. Cl. .............. 313/506; 313/504; 445/24
(58) Field of Classification Search ......... 313/504–506; 445/24–25
See application file for complete search history.

(56) References Cited

U.S. PATENT DOCUMENTS

| 5,079,600 | A | * | 1/1992 | Schnur et al. ............... 257/750 |
| 5,903,101 | A | | 5/1999 | Kijima |
| 6,624,071 | B2 | | 9/2003 | Seki |
| 6,810,919 | B2 | | 11/2004 | Seki et al. |
| 6,861,377 | B1 | * | 3/2005 | Hirai et al. .................. 438/781 |
| 6,948,533 | B2 | | 9/2005 | Seki et al. |
| 7,015,503 | B2 | | 3/2006 | Seki et al. |
| 7,214,959 | B2 | | 5/2007 | Seki et al. |
| 7,234,984 | B2 | * | 6/2007 | Nishikawa et al. ............. 445/2 |
| 2003/0054186 | A1 | | 3/2003 | Miyashita et al. |
| 2005/0170550 | A1 | | 8/2005 | Seki et al. |
| 2005/0186403 | A1 | | 8/2005 | Seki et al. |
| 2005/0268984 | A1 | | 12/2005 | Seki et al. |

FOREIGN PATENT DOCUMENTS

| EP | 989778 A1 * | 3/2000 |
| JP | A 09-204985 | 8/1997 |
| JP | WO 99/48339 A1 | 9/1999 |
| JP | A 2002-237383 | 8/2002 |
| JP | A 2002-372921 | 12/2002 |
| JP | A 2003-347048 | 12/2003 |
| JP | A-2003-347048 | 12/2003 |
| WO | WO 03/061349 A1 | 7/2003 |

* cited by examiner

*Primary Examiner*—Nimeshkumar D. Patel
*Assistant Examiner*—Anne M Hines
(74) *Attorney, Agent, or Firm*—Oliff & Berridge, PLC

(57) ABSTRACT

To provide an organic electroluminescent device that has a uniform brightness distribution and inhibits parasitic capacitance occurring between switching elements, such as thin-film transistors, and a cathode to achieve good display characteristics, a method for producing the organic electroluminescent device, and an electronic appliance. An organic electroluminescent device includes a substrate, scanning lines formed on the substrate, signal lines formed on the substrate, switching elements formed near the intersections of the scanning lines and the signal lines, light-emitting functional layers that emit light according to the operation of the switching elements, a first insulating layer formed between the light-emitting functional layers, a second insulating layer formed between the light-emitting functional layers, and a lyophobic thin film covering the first and second insulating layers. The second insulating layer is not in contact with the light-emitting functional layers. The position of the second insulating layer at least corresponds to the positions of the scanning lines, the signal lines, and the switching elements.

15 Claims, 9 Drawing Sheets

ORGANIC ELECTROLUMINESCENT DEVICE, METHOD FOR PRODUCING THE SAME, AND ELECTRONIC APPLIANCE

BACKGROUND

The present invention relates to organic electroluminescent devices, methods for producing the organic electroluminescent devices, and electronic appliances.

In recent years, development of light-emitting devices using organic materials has been accelerated to provide self-emitting displays as an alternative to liquid crystal displays. Vacuum deposition and wet deposition, for example ink jetting (droplet ejection), are used in known methods for producing such organic electroluminescent devices (referred to as organic EL devices throughout the present specification) using an organic luminescent material. According to a method using vacuum deposition (for example, see Patent Document 1), a luminescent material with a low molecular weight is vaporized while a substrate and the evaporation source are opposed with a mask disposed therebetween, thereby forming a luminescent layer corresponding to the pattern of the mask. According to a method using ink jetting, on the other hand, a liquid material containing a polymeric luminescent material is ejected (applied) according to pattern data, such as a bitmap, to form a luminescent layer corresponding to the pattern data.

Ink jetting allows the ejection and application of droplets with a diameter on the order of micrometers at high resolution, thus offering high-resolution patterning. This method, in which a liquid material is ejected only to a predetermined pattern, also has the advantage that it produces no waste of material and therefore allows the production of organic EL devices at low cost.

In addition, methods for forming relatively lyophobic and lyophilic parts on a substrate are generally known as a preliminary process for ink jetting. For example, a method is known in which a lyophobic resin insulating layer and a lyophilic silicon oxide layer are deposited. Also, a method for forming a lyophilic pattern has recently been known in which a self-assembled lyophobic film is formed on the overall surface of a substrate and is irradiated with ultraviolet light through a mask to partially remove the lyophobic film (for example, see Patent Document 2). In either method, a liquid material landed on the lyophobic part can be allowed to flow toward and remain at the lyophilic part.

An organic EL device produced by ink jetting after the deposition of the lyophobic and lyophilic parts is described below.

FIG. 11($a$) is a partial sectional view of the organic EL device. In FIG. 11($a$), reference numeral 300 indicates a pixel electrode, reference numeral 301 indicates a silicon oxide layer (lyophilic part), reference numeral 302 indicates a resin insulating layer (lyophobic part), reference numeral 303 indicates a hole-injection layer, reference numeral 304 indicates a luminescent layer, and reference numeral 305 indicates a cathode. The hole-injection layer 303 and the luminescent layer 304 are in contact with the resin insulating layer 302 because they are formed by applying liquid materials using ink jetting. When the solvent contained in the liquid materials is dried, the hole-injection layer 303 and the luminescent layer 304 have a thickness profile (cross-sectional shape) that is thinner at its central part xc and is thicker at its ends x1 and x2.

[Patent Document 1] Japanese Unexamined Patent Application Publication No. 9-204985.
[Patent Document 2] Japanese Unexamined Patent Application Publication No. 2002-237383.

SUMMARY

According to the measurement of the brightness distribution of the luminescent layer 304 thus formed, the luminescent layer 304 disadvantageously has nonuniform brightness; as shown in FIG. 11($b$), the brightness is lower at the ends x1 and x2 and is higher at the central part xc. Furthermore, light emission for a long time undesirably deteriorates the brightness of the luminescent layer 304; as shown in FIG. 11($c$), the brightness becomes lower at the central part xc than at the ends x1 and x2.

Such nonuniform brightness not only results in a shorter emission lifetime, but also cannot provide a display with desired luminescent colors.

If, on the other hand, the thickness of the resin insulating layer 302 is reduced in order to provide a uniform thickness at the central part xc and the ends x1 and x2, parasitic capacitance occurs between a thin-film transistor provided under the pixel electrode 300 and the cathode 305, thus undesirably causing cross talk. In addition, the thin-film transistor is susceptible to the parasitic capacitance, thus failing to provide normal switching characteristics and good display quality.

The increase in the parasitic capacitance between the thin-film transistor and the cathode 305 also has the effect of increasing the capacitance load on signal lines and scanning lines and the load on drive circuits for the signal lines and scanning lines. As a result, signals become difficult to transmit through the signal lines and the scanning lines unless the drive capability of the drive circuits is enhanced. This also affects the operation of the switching device.

The present invention has been created in light of the above problems. An object of the present invention is to provide an organic EL device that has layers, such as a hole-injection layer and a luminescent layer, with a uniform cross-sectional profile to achieve a uniform brightness distribution and that can inhibit parasitic capacitance occurring between a switching element, such as a thin-film transistor, and a cathode to achieve good display characteristics, and also provide a method for producing the organic EL device and an electronic appliance.

The present invention provides an organic EL device including a substrate, scanning lines formed on the substrate, signal lines formed on the substrate, switching elements formed near the intersections of the scanning lines and the signal lines, light-emitting functional layers that emit light according to the operation of the switching elements, a first insulating layer formed between the light-emitting functional layers, a second insulating layer formed between the light-emitting functional layers, and a lyophobic thin film covering the first and second insulating layers. The second insulating layer is not in contact with the light-emitting functional layers. The position of the second insulating layer at least corresponds to the positions of the scanning lines, the signal lines, and the switching elements.

The switching elements operate according to the potentials of the scanning lines and the signal lines, and mainly control the light-emitting/non-light-emitting state of the light-emitting functional layers and the light-emitting state in grayscale. In addition to the switching operation, the switching elements function as elements for a signal processing circuit for processing signals provided to the scanning lines and the signal lines or a compensating circuit.

The light-emitting functional layers refer to, for example, hole-injection layers and luminescent layers formed by applying the materials for these layers to electrodes by droplet ejection.

According to the present invention, the position of the second insulating layer at least corresponds to the positions of the scanning lines, the signal lines, and the switching elements, thus greatly reducing parasitic capacitance on the scanning lines, the signal lines, and the switching elements. This organic EL device can therefore inhibit the effect of the parasitic capacitance to prevent cross talk due to the parasitic capacitance. The organic EL device can also reduce the load on drive circuits for the scanning lines and the signal lines to inhibit the delay and distortion of electrical signals transmitted through the scanning lines and the signal lines. This ensures good switching operation of the switching elements to achieve an organic EL device with excellent display quality.

In particular, the present invention is based on the knowledge that the scanning lines, the signal lines, and the switching elements are more susceptible to parasitic capacitance than drive transistors for supplying power to the light-emitting functional layers. The potential of the drive transistors is stable because they are connected to power lines, which are supplied with power at a predetermined potential. On the other hand, the scanning lines, the signal lines, and the switching elements suffer potential variations due to an ambient electric field and parasitic capacitance more readily than the drive transistors.

In the present invention, the second insulating layer is formed in the position corresponding to the scanning lines, the signal lines, and the switching elements to reduce parasitic capacitance on these lines and elements, thereby inhibiting the delay and distortion of electrical signals transmitted through them. By inhibiting the effect of parasitic capacitance, the present invention provides an organic EL device with excellent display quality.

According to the present invention, additionally, the light-emitting functional layers are disposed out of contact with the second insulating layer. When, therefore, the liquid materials for the light-emitting functional layers are applied by droplet ejection to form the light-emitting functional layers, they do not come in contact with the second insulating layer, as opposed to the related art. The liquid materials also do not creep up the first and second insulating layers because the lyophobic thin film covers the first and second insulating layers. Thus the liquid materials can be applied only to the parts that are not covered by the lyophobic thin film. The solvent contained in the liquid materials applied to the parts that are not covered by the lyophobic thin film is dried to form the light-emitting functional layers. The light-emitting functional layers can therefore be formed without creeping up the lyophobic thin film or coming in contact with the second insulating layer. In addition, the light-emitting functional layers can achieve a uniform thickness profile (cross-sectional shape).

The organic EL device may further includes drive elements for driving the light-emitting functional layers to emit light according to the operation of the switching elements. Then, the position of the second insulating layer also corresponds to the positions of the drive elements.

The drive elements refer to elements included in circuits downstream of the switching elements. Examples of the drive elements include the power lines, the drive transistors connected to the power lines, lines between the switching elements and the drive transistors, hold capacitors for maintaining the operation of the drive transistors, and lines between the power lines and the drive transistors. The drive elements operate in accordance with the operation of the switching elements.

According to the present invention, the position of the second insulating layer also corresponds to the positions of the drive elements, thus greatly reducing parasitic capacitance on the drive elements. Along with the above effects, therefore, this organic EL device can further inhibit the effect of the parasitic capacitance to prevent cross talk due to the parasitic capacitance. This ensures good operation of the drive elements to achieve an organic EL device with excellent display quality.

In the organic EL device, the lyophobic thin film may be a monomolecular film.

The lyophobic thin film may be formed by depositing a molecular layer of about monomolecular to bimolecular thickness by wet deposition.

The monomolecular film is preferably made of a coupling agent, which is decomposed by ultraviolet irradiation. The lyophobic thin film may be provided with a predetermined pattern by locally irradiating the lyophobic thin film deposited on the overall surface of the substrate with ultraviolet light.

In the organic EL device, the lyophobic thin film may be a resin film.

The lyophobic thin film may be formed by depositing a resin material by wet deposition. The resin material used is a non-photosensitive or photosensitive resin material. If a non-photosensitive resin material is used, a lyophobic thin film with a predetermined pattern may be formed by photolithography and etching. If, on the other hand, a photosensitive resin material is used, a lyophobic thin film with a predetermined pattern may be formed by development.

The resin material, if having no liquid-repellency, may be provided with liquid-repellency by applying a lyophobic finish to form the lyophobic thin film.

In the organic EL device, the thickness of the lyophobic thin film is preferably not more than 1.5 times the thickness of the light-emitting functional layers.

Such a thickness can reliably prevent the liquid material for the light-emitting functional layers from creeping up the lyophobic thin film after the solvent contained in the materials is dried. In addition, the light-emitting functional layers can be flattened more suitably since the thickness of the lyophobic thin film is not more than 1.5 times.

In the organic EL device, the lyophobic thin film preferably continuously covers the sides of the second insulating layer and the top of the first insulating layer.

This prevents the liquid materials for the light-emitting functional layers from creeping up the top surface of the lyophobic thin film, so that the liquid materials do not come in contact with the second insulating layer. Thus the light-emitting functional layers can be reliably kept out of contact with the sides of the second insulating layer.

In the organic EL device, the first insulating layer preferably has openings in which electrodes are bare so that the electrodes come in contact with the light-emitting functional layers.

Because the light-emitting functional layers come in contact with the electrodes in the openings, carriers can be suitably injected from the electrodes into the light-emitting functional layers. The material for the first insulating layer preferably has lyophilicity so that the liquid materials for the light-emitting functional layers can suitably wet and spread over the electrodes.

The present invention further provides a method for producing an organic EL device including a substrate, scanning lines formed on the substrate, signal lines formed on the substrate, switching elements formed near the intersections of the scanning lines and the signal lines, light-emitting functional layers that emit light according to the operation of the switching elements, a first insulating layer formed between the light-emitting functional layers, and a second insulating layer formed between the light-emitting functional layers. This method includes the step of forming the second insulating layer in the position that is out of contact with the light-emitting functional layers and that at least corresponds to the positions of the scanning lines, the signal lines, and the switching elements, and the step of forming the lyophobic thin film so as to cover the first and second insulating layers.

According to the present invention, the position of the second insulating layer at least corresponds to the positions of the scanning lines, the signal lines, and the switching elements, thus greatly reducing parasitic capacitance on the scanning lines, the signal lines, and the switching elements. This method can therefore inhibit the effect of the parasitic capacitance to prevent cross talk due to the parasitic capacitance. This ensures good switching operation of the switching elements to achieve an organic EL device with excellent display quality.

According to the present invention, additionally, the light-emitting functional layers are disposed out of contact with the second insulating layer. When, therefore, the liquid materials for the light-emitting functional layers are applied by droplet ejection to form the light-emitting functional layers, they do not come in contact with the second insulating layer, as opposed to the related art. The liquid materials also do not creep up the first and second insulating layers because the lyophobic thin film covers the first and second insulating layers. Thus the liquid materials can be applied only to the parts that are not covered by the lyophobic thin film. The solvent contained in the liquid materials applied to the parts that are not covered by the lyophobic thin film is dried to form the light-emitting functional layers. The light-emitting functional layers can therefore be formed without creeping up the lyophobic thin film or coming in contact with the second insulating layer. In addition, the light-emitting functional layers can achieve a uniform thickness profile (cross-sectional shape).

In the method for producing the organic EL device, the step of forming the lyophobic thin film may include the substeps of forming a monomolecular film on the overall surface of the substrate by applying a liquid material containing the material for the monomolecular film, and partially removing the monomolecular film so that electrodes are bare.

Thus a lyophobic thin film made of a monomolecular film can be formed on the part other than the electrodes. In addition, when the liquid materials for the light-emitting functional layers are applied to the bare electrodes, the liquid materials can be allowed to wet and spread only over the electrodes, thus forming the light-emitting functional layers.

In the method for producing the organic EL device, the substep of partially removing the monomolecular film so that the electrodes are bare may be performed by irradiating the monomolecular film with ultraviolet light through a mask having a light-shielding portion and light-transmitting portions.

The ultraviolet light decomposes and removes the irradiated portions of the monomolecular film. The irradiated portions of the monomolecular film can be removed by the ultraviolet light passing through the light-transmitting portions of the mask. On the other hand, the portion of the monomolecular film corresponding to the light-shielding portion of the mask can be left. In other words, the monomolecular film can be removed according to the pattern of the light-shielding portion and the light-transmitting portions of the mask.

In the method for producing the organic EL device, the substep of partially removing the monomolecular film so that the electrodes are bare may be performed by irradiating the monomolecular film with ultraviolet light through the substrate, which has a light-shielding portion and light-transmitting portions.

The substrate functions as a mask, thus allowing maskless ultraviolet irradiation. The light-shielding portion of the substrate preferably corresponds to the scanning lines, the signal lines, the switching elements, the drive elements, and the first and second insulating layers. On the other hand, the light-transmitting portions of the substrate preferably correspond to the electrodes, which are transparent.

In the method for producing the organic EL device, the step of forming the lyophobic thin film may include the substeps of forming a resin film on the overall surface of the substrate by applying a liquid material containing a resin material, partially removing the resin film so that electrodes are bare, and applying a lyophilic finish and a lyophobic finish.

Thus a lyophobic thin film made of a resin material can be formed. In addition, when the liquid materials for the light-emitting functional layers are applied to the bare electrodes, the liquid materials can be allowed to wet and spread only over the electrodes, thus forming the light-emitting functional layers only on the electrodes.

The substep of partially removing the resin film so that electrodes are bare is different according to whether a non-photosensitive resin material or a photosensitive resin material is used. If, for example, a non-photosensitive resin material is used, the resin film can be partially removed by photolithography and etching. If, on the other hand, a photosensitive resin material is used, the resin film can be partially removed by development. In addition, the resin film may be provided with liquid-repellency by applying a lyophobic finish while the electrodes may be provided with lyophilicity by applying a lyophilic finish. Thus the liquid materials are not applied to the resin film, and can be allowed to wet and spread only over the electrodes.

The present invention further provides an electronic appliance including the above organic EL device.

Examples of the electronic appliance include information processors, such as cellular phones, mobile information terminals, watches, word processors, and personal computers, and large-screen televisions and monitors. The electronic appliance, including the organic EL device according to the present invention as a display, can provide excellent display characteristics.

DETAILED DESCRIPTION OF EMBODIMENTS

Figure 1:
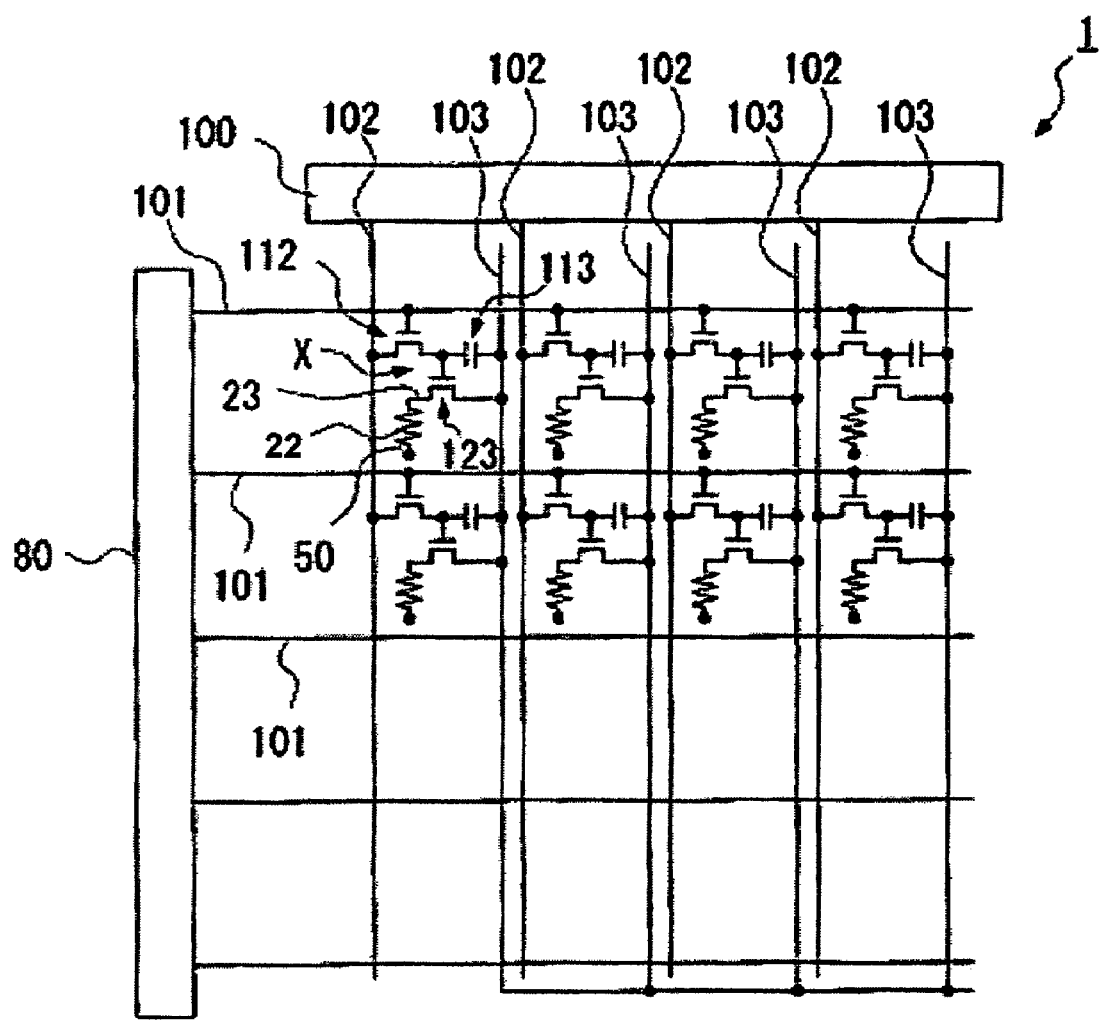
FIG. 1 is a schematic diagram of the wiring structure of an organic EL device according to the present invention.

The present invention will now be described in detail.

The embodiments below show part of the present invention; they do not limit the present invention, and may be suitably modified within the technical scope of the present invention. In the attached drawings, layers and members are drawn at different scales so that they have a viewable size in the drawings.

An organic EL device according to an embodiment of the present invention will be described below. FIG. 1 is a schematic diagram of the wiring structure of an organic EL device 1 according to this embodiment.

The organic EL device 1 is an active-matrix device including thin-film transistors (hereinafter referred to as TFTs) as switching elements. This organic EL device 1 has a wiring structure including scanning lines 101, signal lines 102 extending in the direction orthogonal to the scanning lines 101, and power lines 103 (drive elements) extending in parallel with the individual signal lines 102. Pixel areas X are provided near the individual intersections of the scanning lines 101 and the signal lines 102.

The signal lines 102 are connected to a data-line drive circuit 100 including a shift register, a level shifter, a video line, and an analog switch. On the other hand, the scanning lines 101 are connected to a scanning-line drive circuit 80 including a shift register and a level shifter.

Each pixel area X includes a switching TFT (switching element) 112 having a gate electrode that is supplied with a scanning signal via the scanning lines 101, a hold capacitor (drive element) 113 for holding a pixel signal supplied from the signal lines 102 via the switching TFT 112, a drive TFT (drive element) 123 having a gate electrode that is supplied with the pixel signal held by the hold capacitor 113, a pixel electrode (electrode) 23 into which drive current flows from the power lines 103 when the pixel electrode 23 is electrically connected to the power lines 103 via the drive TFT 123, and a light-emitting functional layer 22 held between the pixel electrode 23 and a cathode 50.

Figure 2:
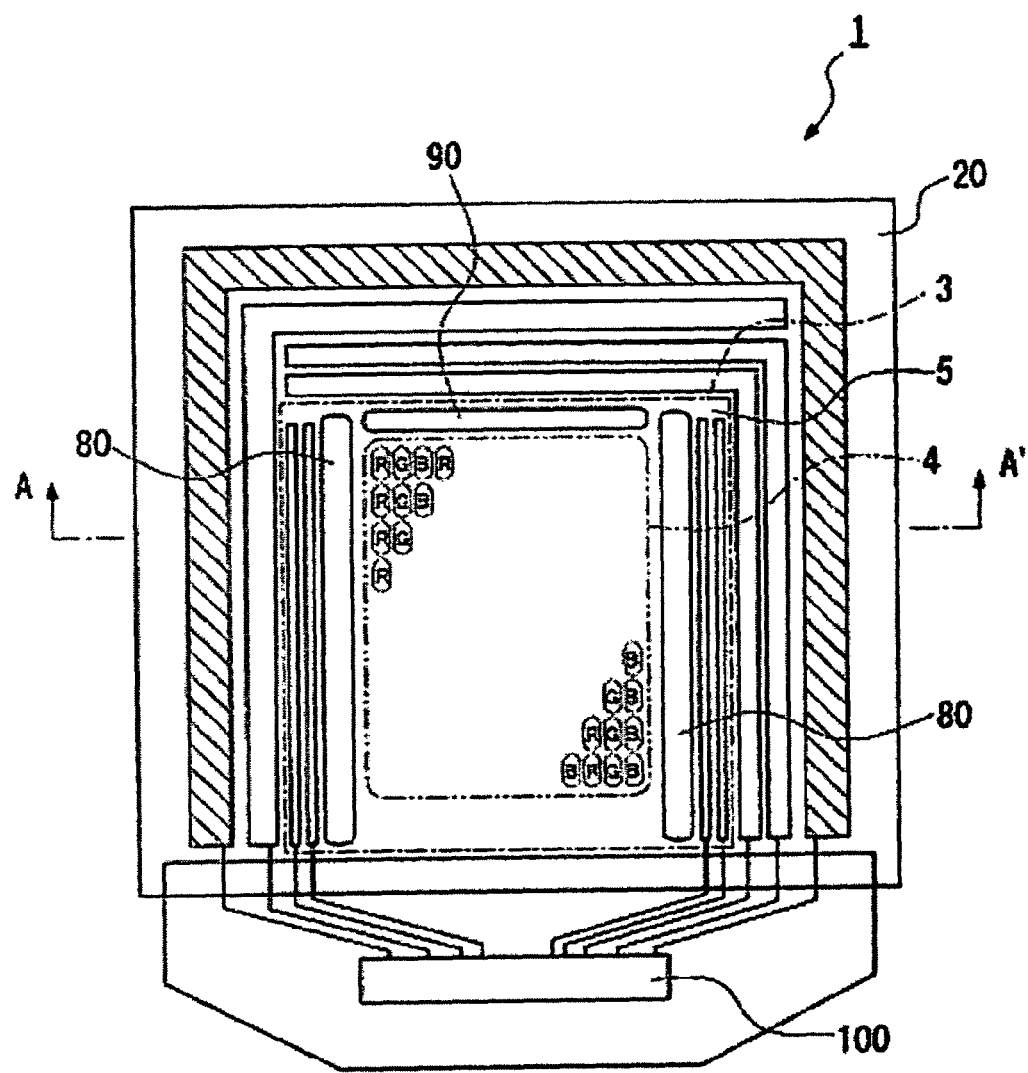
FIG. 2 is a schematic plan view of the organic EL device according to the present invention.
Figure 3:
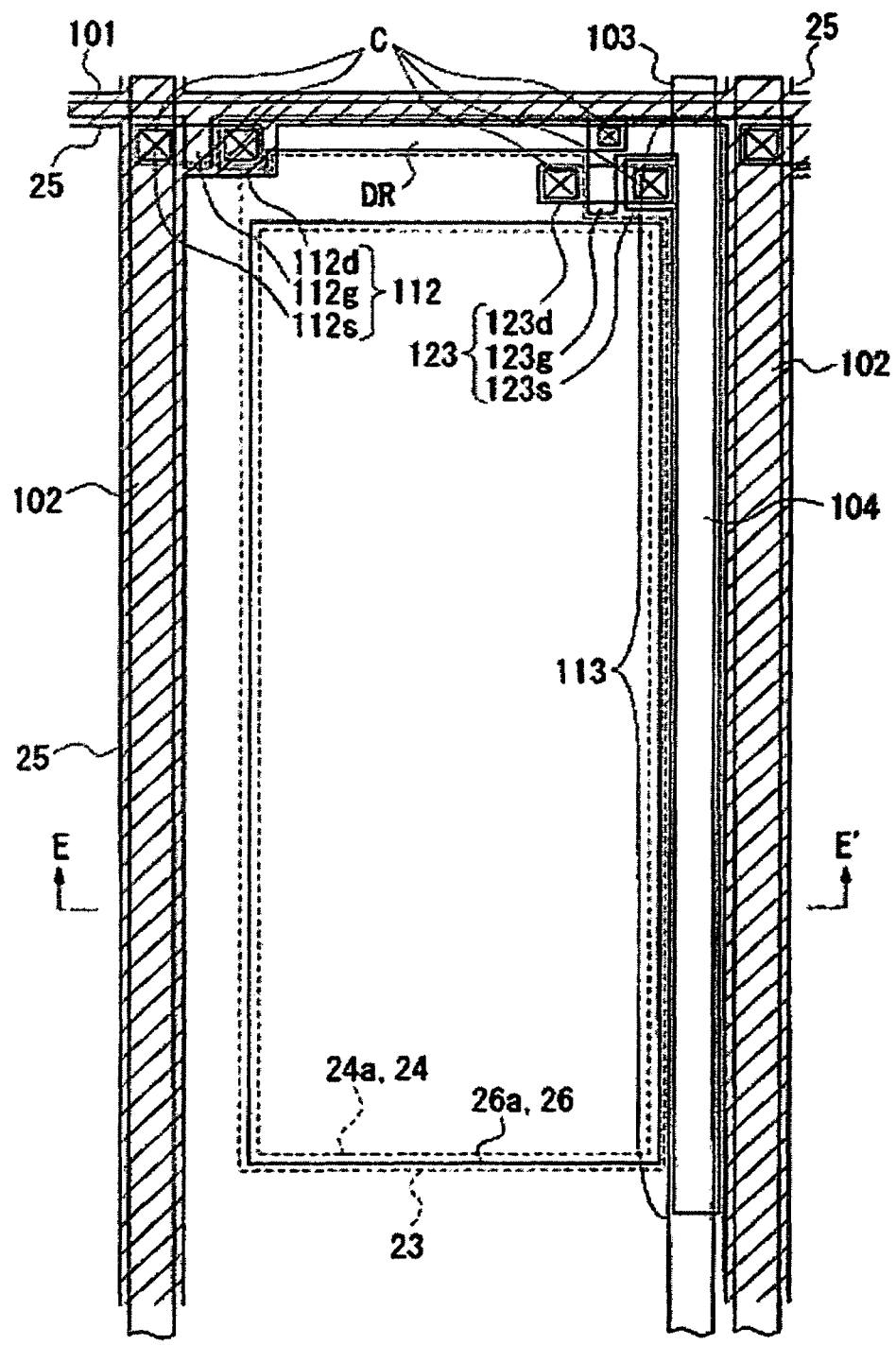
FIG. 3 is a partial plan view of the organic EL device according to the present invention.
Figure 4A:
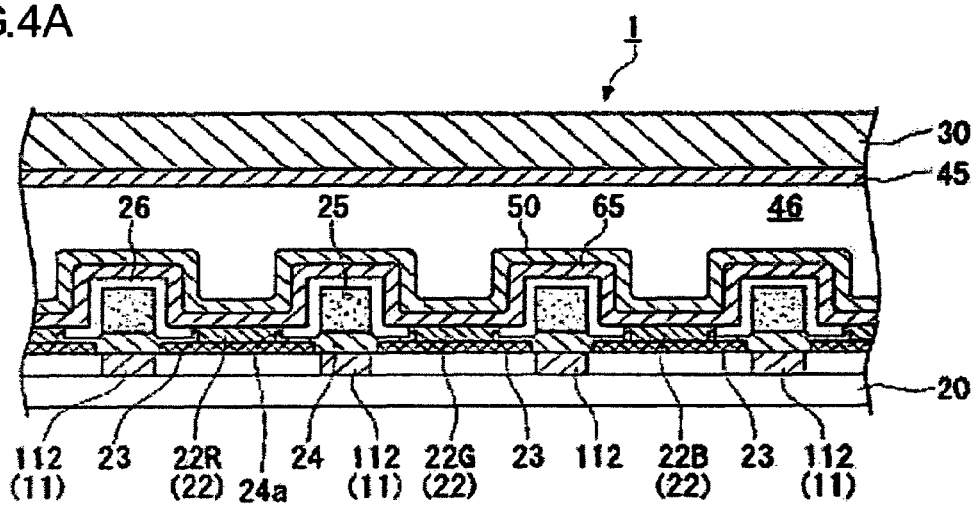
FIGS. 4A-4C show partial sectional views of the organic EL device according to the present invention.
Figure 4B:
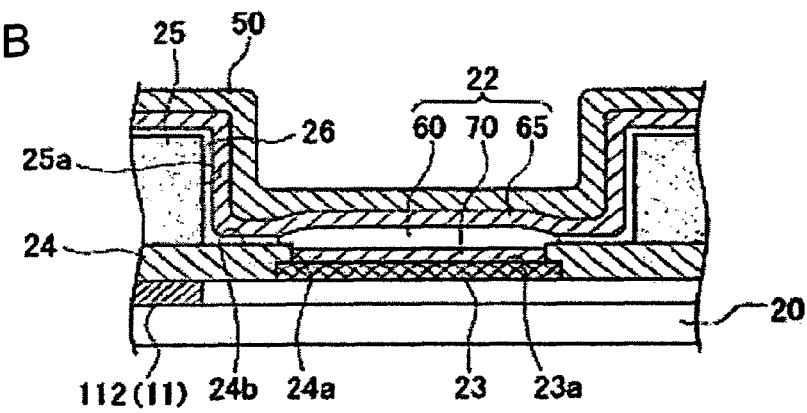
Figure 4C:
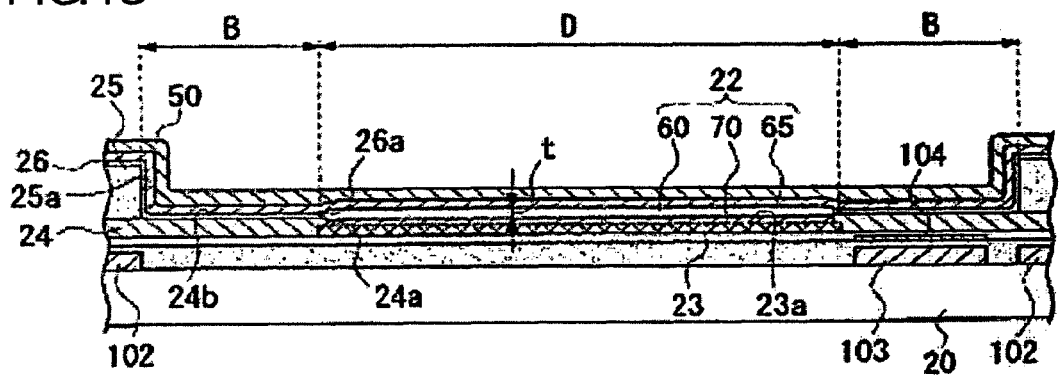

The organic EL device 1 according to this embodiment will be specifically described with reference to FIGS. 2 to 4. FIG. 2 is a schematic plan view of the organic EL device 1. FIG. 3 is an enlarged plan view for illustrating the circuit configuration of the pixel area X in the organic EL device 1. FIG. 4 shows partial sectional views, taken along line A-A' in FIG. 2, of the organic EL device 1. FIG. 4(a) is a sectional view of light-emitting functional layers 22R, 22G, and 22B that emit light in red (R), green (G), and blue (B), respectively, and their vicinity. FIG. 4(b) is a detailed enlarged sectional view of one light-emitting functional layer 22 and its vicinity. FIG. 4(c) is a sectional view, enlarged at the same scale, of the pixel area X shown in FIG. 3.

First, the structure of the organic EL device 1 is described with reference to FIG. 2.

In FIG. 2, the organic EL device 1 according to this embodiment includes a light-transmissive, electrically insulating substrate 20, the pixel areas X (see FIG. 1), in which the pixel electrodes 23 connected to the switching TFTs 112 are arranged in a matrix on the substrate 20, the power lines 103 disposed near the pixel areas X and connected to the individual pixel electrodes 23, and a pixel part 3 (outlined by the one-dot chain line in FIG. 2) that is substantially rectangular in plan view and is at least positioned above the pixel areas X. In this embodiment, the pixel part 3 is divided into a central effective display region 4 (outlined by the two-dot chain line in FIG. 2) and a dummy region 5 (between the one-dot chain line and the two-dot chain line) disposed around the effective display region 4.

In the effective display region 4, display areas R, G, and B including the pixel electrode 23 are regularly arranged in the A-A' direction.

The scanning-line drive circuit 80 is provided on each of both sides of the effective display region 4 in FIG. 2. These scanning-line drive circuits 80 are positioned below the dummy region 5.

A check circuit 90 is disposed on the top side of the effective display region 4 in FIG. 2, and is positioned below the dummy region 5. This check circuit 90 checks the operational state of the organic EL device 1. The check circuit 90 includes, for example, a check information output device (not illustrated) for outputting check results to the outside to check the quality of the display and inspect it for defects during manufacture and before shipment.

The scanning-line drive circuits 80 and the check circuit 90 are supplied with drive voltage from a predetermined power source via drive voltage conducting parts (not illustrated). A predetermined main driver for controlling the operation of the organic EL device 1, for example, transmits drive control signals and applies drive voltage to the scanning-line drive circuits 80 and the check circuit 90 via a drive control signal conducting part (not illustrated) and a drive voltage conducting part (not illustrated). The drive control signals are command signals transmitted by, for example, the main driver to control the output of signals from the scanning-line drive circuits 80 and the check circuit 90.

Next, the circuit configuration of the pixel area X is described with reference to FIG. 3.

In FIG. 3, the pixel area X mainly includes the switching TFT 112 and the drive TFT 123 provided on the substrate 20, the pixel electrode 23, and the hold capacitor 113. Of the above components, the switching TFT 112, the drive TFT 123, and the hold capacitor 113 constitute a circuit part in the pixel area X.

The switching TFT 112 has a gate electrode 112g, a source region 112s, and a drain region 112d. The source region 112s and the drain region 112d are formed on a semiconductor layer made of, for example, polysilicon. A channel region (not illustrated) opposed to the gate electrode 112g is formed between the source region 112s and the drain region 112d. This channel region switches the conduction state between the source region 112s and the drain region 112d by the action of an electric field from the gate electrode 112g. The gate electrode 112g, which is a branch of the scanning lines 101, is supplied with scanning signals from the scanning-line drive circuits 80. The source region 112s and the drain region 112d of the switching TFT 112 are electrically connected to the signal lines 102 and a drain electrode DR, respectively, via contact holes C.

The drive TFT 123 mainly includes a gate electrode 123g, a source region 123s, and a drain region 123d. The source region 123s and the drain region 123d are formed on a semiconductor layer made of, for example, polysilicon. A channel region (not illustrated) is formed between the source region 123s and the drain region 123d. This channel region switches the conduction state between the source region 123s and the drain region 123d by the action of an electric field from the gate electrode 123g. The gate electrode 123g is electrically connected to the drain electrode DR via another contact hole C, and is integrated with a capacitor electrode 104 extending along the power lines 103. The source region 123s is electrically connected to the power lines 103 via another contact hole C while the drain region 123d is electrically connected to the pixel electrode 23 via another contact hole C formed in an interlayer insulating film and a drain electrode (not illustrated) embedded in the contact hole C as a relay conducting member.

The hold capacitor 113 is formed in the region where the power lines 103 and the capacitor electrode 104 are opposed. The capacitor electrode 104, which is electrically connected to the gate electrode 123g and the drain electrode DR, holds image signals supplied via the drain region 112d and supplies the image signals to the gate electrode 123g.

A silicon oxide layer (first insulating layer) 24, a resin insulating layer (second insulating layer) 25, and a lyophobic film (lyophobic thin film) 26 are sequentially deposited on the upper side of the pixel electrode 23, as will be described later. The silicon oxide layer 24 and the lyophobic film 26 have openings 24a and 26a, respectively. The pixel electrode 23 is bare in the openings 24a and 26a so that the light-emitting functional layer 22, which will be described later, comes into contact with the pixel electrode 23. As described above as a feature of the present invention, the position of the resin insulating layer 25 corresponds to the positions of the scanning lines 101, the signal lines 102, and the switching TFT 112; they overlap in plan view. In this embodiment, the resin insulating layer 25 does not overlap with the drive TFT 123 and the hold capacitor 113.

In the above organic EL device 1, when the scanning lines 101 are driven to turn on the switching TFT 112, the potential of the signal lines 102 at that time is held by the hold capacitor 113. The on/off state of the drive TFT 123 depends on the state of the hold capacitor 113. Current flows from the power lines 103 into the cathode 50 via the channel of the drive TFT 123, the pixel electrode 23, and the light-emitting functional layer 22. The light-emitting functional layer 22 then emits light according to the amount of current flowing through it.

Next, the sectional structure of the organic EL device 1 is described with reference to FIG. 4.

In FIG. 4(a), the organic EL device 1 is produced by bonding the substrate 20 and a sealing substrate 30 with a sealing resin (not illustrated) disposed therebetween. A gettering agent 45 for absorbing moisture and oxygen is attached to the inner surface of the sealing substrate 30 in the space surrounded by the substrate 20, the sealing substrate 30, and the sealing resin. A nitrogen gas is charged into the space to form a nitrogen gas layer 46. This structure inhibits the permeation of moisture and oxygen into the organic EL device 1 in order to increase its life.

The organic EL device 1, if having a top-emission structure, emits light through the opposite side of the substrate 20, namely the sealing substrate 30. The substrate 20 may then be made of either transparent or nontransparent material. Examples of the nontransparent material used include ceramics such as alumina, metal sheets, such as stainless steel sheets, subjected to an insulation process such as surface oxidation, thermosetting resins, and thermoplastic resins.

The organic EL device 1, if having a bottom-emission structure, emits light through the substrate 20. The substrate 20 is then made of a transparent or translucent material. Examples of the material used include glass, quartz, and resins (plastic materials and films); among them, a glass substrate is preferably used. In this embodiment, the bottom-emission structure is employed, in which light is emitted through the substrate 20, and therefore a transparent or translucent substrate is used as the substrate 20.

The sealing substrate 30 used may be, for example, an electrically insulating board having gas barrier properties. Also, the sealing resin used is preferably an electrically insulating material having gas barrier properties, for example a thermosetting resin or an ultraviolet curable resin. In particular, epoxy resin, which is one of thermosetting resins, is preferably used.

Circuit parts (switching elements) 11 are formed on the substrate 20. As shown in FIG. 1, the circuit parts 11 include the scanning lines 101, the signal lines 102, the switching TFTs 112, the drive TFTs 123, and the hold capacitors 113. The circuit parts 11 may have a signal processing circuit including, for example, four or five transistors. The signal processing circuit may be provided in each pixel area. Examples of the signal processing circuit include a compensation circuit for compensating for variations in the operation of the TFTs and the light-emitting functional layers 22, a current-programmed circuit, a voltage-programmed circuit, a voltage comparator circuit, and a subframe-type circuit. As described above, the positions of the scanning lines 101, the signal lines 102, and the switching TFTs 112 in the circuit parts 11 correspond to the position of the resin insulating layer 25; they overlap in plan view, as shown in FIG. 3. If the circuit parts 11 are provided with the signal processing circuit, the signal processing circuit is formed such that its position corresponds to the position of the resin insulating layer 25.

The silicon oxide layer 24 and the resin insulating layer 25 are provided above the switching TFTs 112, and are covered with the lyophobic film 26.

The silicon oxide layer 24 is adjacent to the pixel electrodes 23, and has the openings 24a in which the pixel electrodes 23 are partially bare. The silicon oxide layer 24 has an affinity for liquid materials. The layer 24, which is made of $SiO_2$ in this embodiment, may be made of another inorganic material or an organic material.

The resin insulating layer 25 is formed on the silicon oxide layer 24 in a position out of contact with the light-emitting functional layers 22 described later. The resin insulating layer 25 is made of an organic material such as acrylic resin and polyimide resin. The resin insulating layer 25 preferably has a thickness of about 2 μm. Though the sides 25a of the resin insulating layer 25 are substantially perpendicular to the surface of the substrate 20 in FIG. 4(b), the sides 25a may be inclined at a predetermined angle.

The lyophobic film 26 is formed so as to cover the silicon oxide layer 24 and the resin insulating layer 25. The lyophobic film 26 is not formed in the openings 24a in the silicon oxide layer 24, namely not formed on bare parts 23a of the pixel electrodes 23. The lyophobic film 26 continuously covers the sides 25a of the resin insulating layer 25 and the top 24b of the silicon oxide layer 24.

The lyophobic film 26 is a monomolecular film made of perfluoroalkyltrimethoxysilane. The lyophobic film 26 is preferably of about monomolecular to bimolecular thickness. The material for the lyophobic film 26 is a silane coupling agent in this embodiment; the coupling agent used is preferably an alkylated metal compound (for example, titanium-based or silane-based) having a lyophobic group such as a fluoroalkyl or fluoroallyl group that has or does not have an aromatic substituent.

The term "liquid-repellency" means that the lyophobic film 26 is at least more lyophobic than materials such as the material for the silicon oxide layer 24 ($SiO_2$ in this embodiment).

In this embodiment, in which the bottom-emission structure is employed, the pixel electrodes 23 are made of a transparent conductive material. A preferred example of the transparent conductive material used is indium tin oxide (ITO). Other examples include an amorphous transparent conductive film based on indium oxide and zinc oxide (indium zinc oxide (IZO®), manufactured by Idemitsu Kosan Co., Ltd.), though ITO is used in this embodiment. For the top-emission structure, on the other hand, the material for the pixel electrodes 23 is not limited to light-transmissive materials, and, for example, aluminum (Al) may be provided on the bottom of ITO as a reflective layer. In FIG. 4(a), the light-emitting functional layers 22R, 22G, and 22B, which emit light in R, G, and B, respectively, are formed on the bare parts 23a of the pixel electrodes 23.

Referring to FIG. 4(b), each light-emitting functional layer 22 has a structure in which a hole-injection layer 70, a luminescent layer 60, and an electron-injection layer 65 are laminated on the pixel electrode 23 in the above order. The hole-injection layer 70 serves to inject/transport holes from the pixel electrode 23 into the luminescent layer 60. The electron-injection layer 65 serves to inject/transport electrons from the cathode 50 described later into the luminescent layer 60. The luminescent layer 60 serves to emit light by combining the holes and electrons injected. The luminescent layers 60 for the light-emitting functional layers 22R, 22G, and 22B are made of different materials.

A preferred example of the material for the hole-injection layer 70 is a dispersion of poly(3,4-ethylenedioxythiophene)/poly(styrene sulfonate) (PEDOT/PSS). This dispersion is prepared by dispersing poly(3,4-ethylenedioxythiophene) in poly(styrene sulfonate), as a dispersion medium, and further dispersing it in water.

The material for the hole-injection layer 70 is not limited to the above material, and various materials may be used, including a dispersion of, for example, polystyrene, polypyrrole, polyaniline, polyacetylene, or a derivative thereof in a proper dispersing medium such as poly(styrene sulfonate) above.

The luminescent layers 60 may be made of known fluorescent or phosphorescent materials. In this embodiment, the luminescent layers 60 have the emission wavelength bands corresponding to the primary colors of light to provide a full-color display. That is, the luminescent layers 60 for the light-emitting functional layers 22R have the emission wavelength band corresponding to red, the luminescent layers 60 for the light-emitting functional layers 22G have the emission wavelength band corresponding to green, and the luminescent layers 60 for the light-emitting functional layers 22B have the emission wavelength band corresponding to blue. Each pixel includes the three light-emitting functional layers 22R, 22G, and 22B. The light-emitting functional layers 22R, 22G, and 22B emit light in grayscale so that the organic EL device 1 can provide a full-color display on the whole.

Preferred examples of the materials for the luminescent layers 60 include polyfluorenes (PFs), poly(p-phenylene vinylene)s (PPVs), polyphenylenes (PPs), poly(p-phenylene)s (PPPs), polyvinylcarbazole (PVK), polythiophenes, and polysilanes such as poly(methylphenylsilane) (PMPS). These polymeric materials may be doped with a polymeric material such as a perylene dye, a coumarin dye, and a rhodamine dye or a low-molecular-weight material such as rubrene, perylene, 9,10-diphenylanthracene, tetraphenylbutadiene, Nile red, coumarin 6, and quinacridone.

In this embodiment, the material for the red luminescent layers 60 is poly(3-methoxy-6-(3-ethylhexyl)-p-phenylenevinylene) (MEHPPV), the material for the green luminescent layers 60 is a mixed solution of polydioctylfluorene and F8BT (an alternating copolymer of dioctylfluorene and benzothiadiazole), and the material for the blue luminescent layers 60 is polydioctylfluorene. The material for the blue luminescent layers 60 may also be a polyfluorene-based or poly (p-phenylene)-based conjugated polymer.

The thickness of the luminescent layers 60 is not particularly limited; a preferred thickness is different for each color. For example, the blue luminescent layers 60 preferably have a thickness of about 60 to 70 nm.

The electron-injection layer 65 is formed on the luminescent layers 60. A material suitable for the electron-injection layer 65 is selected according to the materials for the light-emitting functional layers 22R, 22G, and 22B. Preferred examples of the material used include alkali metal fluorides, such as lithium fluoride (LiF), sodium fluoride (NaF), potassium fluoride (KF), rubidium fluoride (RbF), and cesium fluoride (CsF), and alkali metal oxides, such as lithium oxide ($Li_2O$) and sodium oxide ($Na_2O$). The electron-injection layer 65 preferably has a thickness of about 0.5 to 10 nm.

The area of the cathode 50 is larger than the total area of the effective display region 4 and the dummy region 5 so that the cathode 50 can cover the effective display region 4 and the dummy region 5. The cathode 50 is composed of a first cathode that is made of a low work function metal and is provided on the electron-injection layer 65 and a second cathode that is provided on the first cathode to protect it. The low work function metal for the first cathode preferably has a work function of 3.0 eV or less. Preferred examples of such a metal include Ca (work function: 2.6 eV), Sr (work function: 2.1 eV), and Ba (work function: 2.5 eV). The second cathode is provided to cover and protect the first cathode from, for example, oxygen and moisture and to increase the conductivity of the overall cathode 50. The second cathode may be made of any material having chemical stability and a relatively low work function. The material used is exemplified by metals and alloys; specifically, Al and silver (Ag) are preferably used.

The organic EL device 1 has a bottom-emission structure in this embodiment, though the structure used is not limited to the bottom-emission structure. The organic EL device 1 may have a top-emission structure in which light is emitted through the sealing substrate 30.

The organic EL device 1, if having the top-emission structure, emits light through the sealing substrate 30 in opposition to the substrate 20. The substrate 20 may then be made of either transparent or nontransparent material. Examples of the nontransparent material used include ceramics such as alumina, metal sheets, such as stainless steel sheets, subjected to an insulation process such as surface oxidation, thermosetting resins, and thermoplastic resins.

Next, the sectional structure of each pixel area X is described with reference to FIG. 4(c). FIG. 4(c) is a sectional view, taken along line E-E' in FIG. 3, of the pixel area X. In FIG. 4(c), the individual components are drawn at the same scale.

In FIG. 4(c), the distance B between the opening 26a of the lyophobic film 26 and the sides 25a of the resin insulating layer 25 is about 10 μm. Specifically, the distance B is determined properly according to the content of the solute in the liquid materials used for forming the hole-injection layers 70 and the luminescent layers 60 by ink jetting (droplet ejection). If, for example, the content of the solute is 0.5% to 1.0%, the distance B is preferably set to 10 μm. If, for example, the content of the solute is 1.0% to 2.0%, the distance B is preferably set to 8 μm. If, for example, the content of the solute is less than 0.5%, the distance B is preferably set to 10 μm or more. A suitable distance B prevents droplets ejected by ink jetting from coming into contact with the sides 25a of the resin insulating layer 25, thus enabling the formation of the hole-injection layers 70 and the luminescent layers 60 with a predetermined profile.

The total thickness t of the hole-injection layers 70 and the luminescent layers 60 is 100 nm, and a distance D is 50 μm.

In FIGS. 3 and 4(c), the signal lines 102 are disposed below the resin insulating layer 25, and overlap with it in plan view. In FIG. 3, in addition to the signal lines 102, the scanning lines 101 and the switching TFT 112 are disposed below the resin insulating layer 25, and overlap with it in plan view.

The power lines 103 are formed next to the signal lines 102. The capacitor electrode 104 is opposed to the power lines 103. The power lines 103 and the capacitor electrode 104 are formed below the pixel electrode 23.

(Method for Producing Organic EL Device According to First Embodiment)

A method for producing an organic EL device according to a first embodiment of the present invention will now be described with reference to FIGS. 1 to 7.

Referring to FIG. 4(a), the circuit parts 11 are formed on the substrate 20. The circuit parts 11 include the scanning lines 101, the signal lines 102, the switching TFTs 112, the drive TFTs 123, the power lines 103, and the hold capacitors 113 (see FIG. 3). The circuit parts 11 are preferably formed by a known method such as photolithography and etching. The semiconductors used for the drive TFTs 123 and the switching TFTs 112 have a drain region, a source region, and a channel region. These regions are preferably formed by, for example, ion doping.

In the step of forming the circuit parts 11, interlayer insulating films are preferably formed when the individual layers are deposited. Contact holes are formed in the topmost interlayer insulating film of the circuit parts 11 so that the drain electrodes of the drive TFTs 123 are bare.

The overall surface of the substrate 20 is covered with a conductive film for forming the pixel electrodes 23.

This conductive film is patterned to form the pixel electrodes 23, which are connected to the drain electrodes of the drive TFTs 123 via the contact holes.

The silicon oxide layer 24 is then formed.

The silicon oxide layer 24 has the openings 24a, in which the pixel electrodes 23 are partially bare. The openings 24a are formed so that holes can move from the bare parts 23a of the pixel electrodes 23.

The resin insulating layer 25 is then formed.

The resin insulating layer 25 is formed such that it covers predetermined positions on the silicon oxide layer 24 and overlaps with the scanning lines 101, the signal lines 102, and the switching TFTs 112, as shown in FIG. 3.

A method for forming the resin insulating layer 25 is specifically described. For example, a solution containing a resist such as acrylic resin and polyimide resin is applied by an application method such as spin coating and dip coating to form an organic layer. This organic layer is then patterned by, for example, photolithography or etching to form the resin insulating layer 25. This resin insulating layer 25 is disposed on the silicon oxide layer 24 and is separated from the bare parts 23a so as not to come into contact with the liquid materials applied for forming the light-emitting functional layers 22 in the subsequent steps.

The material used for the resin insulating layer 25 may be a non-photosensitive or photosensitive resin material. If a non-photosensitive resin material is used, the resin insulating layer 25 may be formed according to the mask pattern used in photolithography. If, on the other hand, a photosensitive resin material is used, the resin insulating layer 25 may be formed by development without the need for a step of applying a photoresist used in photolithography or an etching step.

In this embodiment, the resin insulating layer 25 is formed on the silicon oxide layer 24; a black matrix may be formed between each two pixel electrodes 23 by sputtering with chromium.

The lyophobic film 26 is then formed.

An alcohol solution of 1% perfluoroalkyltrimethoxysilane is applied to the overall surface of the substrate 20 by dipping, and is rinsed with alcohol to form the lyophobic film 26. The lyophobic film 26 is a monomolecular film of about monomolecular to bimolecular thickness.

Figure 5:
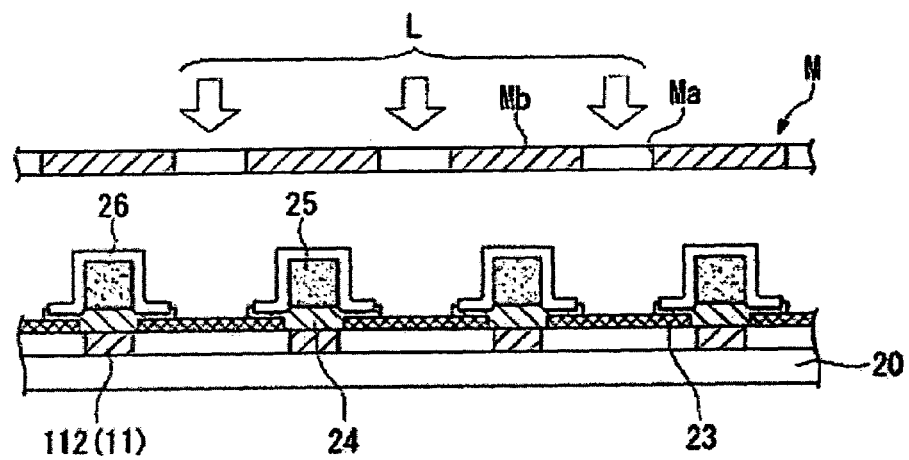
FIG. 5 illustrates a method for producing an organic EL device according to a first embodiment of the present invention.

Referring to FIG. 5, the monomolecular film is irradiated with ultraviolet light L through a mask M to form a predetermined pattern. The mask M has light-transmitting portions Ma corresponding to the bare parts 23a of the pixel electrodes 23 and a light-shielding portion Mb, namely the rest of the mask M. The ultraviolet light L passing through the light-transmitting portions Ma of the mask M impinges on the monomolecular film to decompose and remove the irradiated portions. The irradiation with the ultraviolet light L is preferably performed using a low-pressure mercury lamp with a wavelength of 245 nm. After the irradiation, the lyophobic film 26 is left on the parts other than the bare parts 23a. This lyophobic film 26 continuously covers the sides 25a of the resin insulating layer 25 and the top 24b of the silicon oxide layer 24.

In this embodiment, the lyophobic film 26 is formed after the resin insulating layer 25 is formed; before the lyophobic film 26 is formed, the overall surface of the substrate 20 may be treated with a lyophobic finish to ensure the lyophilicity of the bare parts 23a of the pixel electrode 23. The lyophilic finish is preferably $O_2$ plasma treatment.

The material used is a silane coupling agent in this embodiment, though the material used is not limited to it. Other preferred examples of the material used include an alkylated metal compound (for example, titanium-based) having a lyophobic group such as a fluoroalkyl or fluoroallyl group that has or does not have an aromatic substituent.

The hole-injection layers 70 are then formed.

Figure 6:
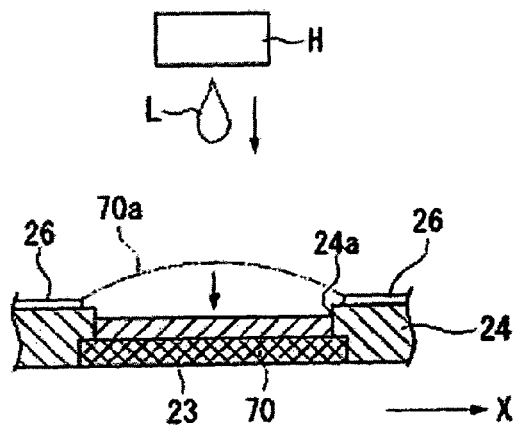
FIG. 6 illustrates the method for producing the organic EL device according to the first embodiment of the present invention.

Ink jetting is preferably used as a method for forming the hole-injection layers 70. Referring to FIG. 6, a liquid material containing the material for the hole-injection layers 70 is charged into an inkjet head H. A discharge nozzle of the inkjet head H is allowed to face the bare parts 23a in the openings 24a of the silicon oxide layer 24. While the inkjet head H is shifted with respect to the substrate 20, a droplet L with a predetermined volume is ejected from the discharge nozzle onto each bare part 23a. Thus a liquid material 70a containing the material for the hole-injection layers 70 is selectively applied to the bare parts 23a of the pixel electrodes 23.

The liquid material 70a ejected from the discharge nozzle spreads over the bare parts 23a to fill the openings 24a of the silicon oxide layer 24. On the other hand, the droplets L are repelled and do not stick to the top surface of the lyophobic film 26. Even if the droplets L deviate from predetermined ejection positions and partially splash the surface of the lyophobic film 26, the droplets L do not wet or creep up the surface. The droplets L repelled by the lyophobic film 26 are therefore drawn into the openings 24a of the silicon oxide layer 24.

The step of forming the hole-injection layers 70 and the subsequent steps are preferably performed in an inert gas atmosphere such as a nitrogen atmosphere and an argon atmosphere to prevent the oxidation and moisture absorption of the materials for the individual components and the components formed.

Subsequently, the solvent contained in the liquid material 70a is evaporated by drying and heat treatment to form the hole-injection layers 70 on the bare parts 23a of the pixel electrodes 23. An example of the material for the hole-injection layers 70 is a solution of PEDOT:PSS above in a polar solvent such as isopropyl alcohol.

The luminescent layers 60 are then formed.

Figure 7:
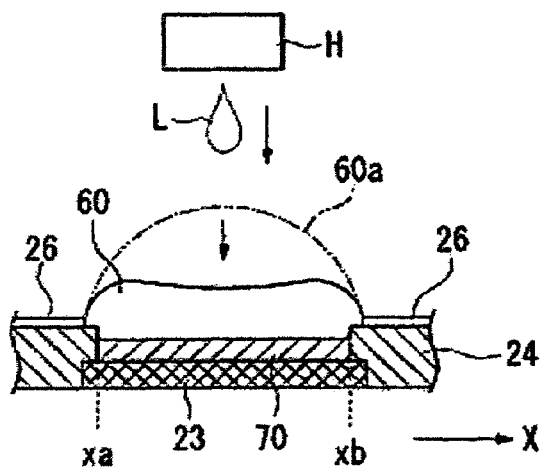
FIG. 7 illustrates the method for producing the organic EL device according to the first embodiment of the present invention.

As in the formation of the hole-injection layers 70, ink jetting is preferably used as a method for forming the luminescent layers 60. Referring to FIG. 7, a liquid material 60a containing the material for the luminescent layers 60 is ejected onto the hole-injection layers 70 by ink jetting. The droplets L are repelled and do not stick to the top surface of the lyophobic film 26. Even if the droplets L deviate from predetermined ejection positions and splash the surface of the lyophobic film 26, the droplets L do not wet or creep up the surface. The droplets L repelled by the lyophobic film 26 are therefore drawn into the openings 24a of the silicon oxide layer 24. The liquid material 60a is convex on the hole-injection layers 70.

Subsequently, the solvent contained in the liquid material 60a is evaporated by drying and heat treatment to form the luminescent layers 60 on the hole-injection layers 70. The luminescent layers 60 are formed separately for each color, namely R, G, and B. The top surfaces of the luminescent layers 60 are substantially flattened by the drying.

In the step of forming the luminescent layers 60, a nonpolar solvent, which is insoluble to the hole-injection layers 70, is used as the liquid material 60a containing the material for the luminescent layers 60 to prevent the redissolution of the hole-injection layers 70.

The electron-injection layer 65 is then formed.

In the step of forming the electron-injection layer 65, for example, an alkali metal fluoride or oxide film with a thickness of about 2 nm is deposited by vapor deposition or sputtering to form the electron-injection layer 65. LiF is deposited in this embodiment, though NaF may be deposited instead of LiF to form the electron-injection layer 65.

The cathode 50 is then formed.

In the step of forming the cathode 50, the first cathode 50a is formed on the electron-injection layer 65, and the second cathode 50b is formed on the first cathode 50a. In this step, as in the formation of the electron-injection layer 65, a low work function metal, namely Ca, Ba, or Sr, is deposited by, for example, vapor deposition or sputtering to form the first cathode 50a.

Subsequently, for example, Al is deposited on the first cathode 50a by vapor deposition or sputtering to form the second cathode 50b. The first cathode 50a and the second cathode 50b constitute the cathode 50.

Unlike the hole-injection layers 70 and the luminescent layers 60, the electron-injection layer 65 and the cathode 50 are formed by, for example, vapor deposition or sputtering. The materials for the electron-injection layer 65 and the cathode 50 are therefore applied to substantially the overall surface of the substrate 20, rather than being selectively applied only to the pixel electrodes 23.

After the cathode 50 is formed, the sealing substrate 30 is provided in a sealing step. In this sealing step, the gettering agent 45 is attached to the inside of the sealing substrate 30, and the sealing substrate 30 and the substrate 20 are sealed with the sealing resin 40, thus completing the organic EL device 1 shown in FIG. 4(a). Also, the sealing step is preferably performed in an inert gas atmosphere such as nitrogen, argon, and helium.

In the organic EL device 1 and the method for producing the organic EL device 1 according to this embodiment, as described above, the resin insulating layer 25 is formed in the position corresponding to the scanning lines 01, the signal lines 102, and the switching TFTs 112 to inhibit parasitic capacitance occurring between these components and the cathode 50, thus preventing cross talk. By inhibiting the parasitic capacitance, additionally, the switching TFTs 112 can achieve good switching characteristics to provide excellent display quality for the organic EL device 1.

In addition, the light-emitting functional layers 22 are disposed out of contact with the resin insulating layer 25. When, therefore, the liquid materials for the light-emitting functional layers 22 are applied by droplet ejection to form the light-emitting functional layers 22, they do not come in contact with the resin insulating layer 25, as opposed to the related art. The liquid materials also do not creep up the silicon oxide layer 24 and the resin insulating layer 25 because the lyophobic film 26 covers the silicon oxide layer 24 and the resin insulating layer 25. Thus the liquid materials can be applied only to the parts that are not covered by the lyophobic film 26. The solvent contained in the liquid materials applied to the parts that are not covered by the lyophobic film 26 is dried to form the light-emitting functional layers 22. The light-emitting functional layers 22 can therefore be formed without creeping up the lyophobic film 26 or coming in contact with the resin insulating layer 25. In addition, the light-emitting functional layers 22 can achieve a uniform thickness profile (cross-sectional shape).

The lyophobic film 26 is a monomolecular film of about monomolecular to bimolecular thickness. The monomolecular film may therefore be formed by wet deposition. The lyophobic film 26, which is made of a coupling agent, may be formed in a predetermined pattern by irradiation with the ultraviolet light L.

The lyophobic film 26 continuously covers the sides 25a of the resin insulating layer 25 and the top 24b of the silicon oxide layer 24 so that the liquid materials for the light-emitting functional layers 22 cannot creep up the top surface of the lyophobic film 26 or come in contact with the resin insulating layer 25. The lyophobic film 26 can therefore reliably keep the light-emitting functional layers 22 out of contact with the sides 25a of the resin insulating layer 25.

The silicon oxide layer 24 has the openings 24a, in which the pixel electrodes 23 are bare. The pixel electrodes 23 are disposed in contact with the light-emitting functional layers 22 so that holes can be suitably injected from the pixel electrodes 23 into the light-emitting functional layers 22. In addition, the material for the silicon oxide layer 24 preferably has lyophilicity so that the liquid materials for the light-emitting functional layers 22 can suitably wet and spread over the pixel electrodes 23.

The step of forming the lyophobic film 26 includes the substeps of applying the liquid material containing the material for the monomolecular film to form the monomolecular film on the overall surface of the substrate 20 and partially removing the monomolecular film so that the pixel electrodes 23 are bare. The monomolecular film can therefore be left on the part other than the pixel electrodes 23 to form the lyophobic film 26. In addition, when the liquid materials for the light-emitting functional layers are applied to the bare electrodes 23, the liquid materials can be allowed to wet and spread only over the pixel electrodes 23, thus forming the light-emitting functional layers 22.

The monomolecular film is partially removed by irradiation with the ultraviolet light L through the mask M so that the pixel electrodes 23 are bare. The ultraviolet light L can decompose and remove the irradiated portions of the monomolecular film. The irradiated portions of the monomolecular film can be removed by the ultraviolet light L passing through the light-transmitting portions Ma of the mask M. On the other hand, the portion of the monomolecular film corresponding to the light-shielding portion Mb of the mask M can be left. In other words, the monomolecular film can be removed according to the pattern of the light-shielding portion Mb and the light-transmitting portions Ma of the mask M.

Each pixel area X, which has two transistors, namely the switching TFT 112 and the drive TFT 123, in this embodiment, may have more than two transistors, for example four or five. In such a configuration, a signal processing circuit may be provided in each pixel area. Examples of the signal processing circuit include a compensation circuit for compensating for variations in the operation of the TFTs and the light-emitting functional layers 22, a current-programmed circuit, a voltage-programmed circuit, a voltage comparator circuit, and a subframe-type circuit. The resin insulating layer 25 may be formed in the position corresponding to the signal processing circuit so that they overlap in plan view. This inhibits the effect of parasitic capacitance on the signal processing circuit, thus providing the organic EL device 1 with excellent display quality.

The resin insulating layer 25, which is formed so that it overlaps with the scanning lines 101, the signal lines 102, and the switching TFTs 112 in the above embodiment, may be formed so that it also overlaps with the drive TFTs 123 and the hold capacitors 113. The effect of parasitic capacitance on the drive TFTs 123 and the hold capacitors 113 are nearly negligible in comparison with that on the scanning lines 101, the signal lines 102, and the switching TFTs 112 because the drive TFTs 123 and the hold capacitors 113 are connected to the power lines 103 at a constant potential. Nevertheless, the resin insulating layer 25 may be formed so that it also overlaps with the drive TFTs 123 and the hold capacitors 113 to further inhibit the deterioration in display characteristics due to parasitic capacitance.

(Method for Producing Organic EL Device According to Second Embodiment)

A method for producing an organic EL device according to a second embodiment of the present invention will now be described with reference to FIG. 8.

Only parts different from the above first embodiment are described below. The lyophobic film 26, which is irradiated with the ultraviolet light L through the mask M in the first embodiment, is irradiated with the ultraviolet light L without the mask M in this embodiment. In this embodiment, the same components are indicated by the same reference numerals to simplify the description below.

Figure 8:
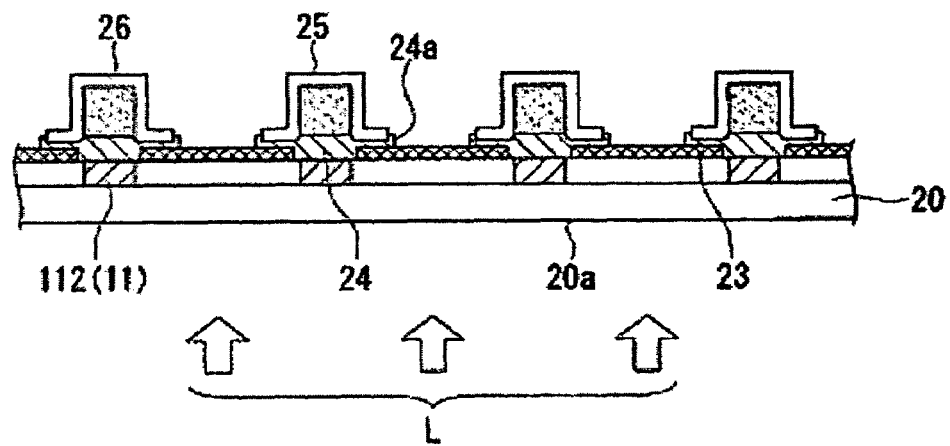
FIG. 8 illustrates a method for producing an organic EL device according to a second embodiment of the present invention.

Referring to FIG. 8, the substrate 20 is irradiated with the ultraviolet light L on its reverse side 20a, namely the side on which the silicon oxide layer 24 and the resin insulating layer 25 are not formed. No mask is used in the step of irradiation with the ultraviolet light L. The ultraviolet light L entering the reverse side 20a of the substrate 20 passes through the pixel electrodes 23 (light-transmitting portions), which are made of a transparent metal material, in the openings 24a to impinge on the lyophobic film 26 formed on the pixel electrodes 23. As a result, the irradiated portions of the lyophobic film 26 are removed. On the other hand, the portion of the lyophobic film 26 formed above the silicon oxide layer 24 (light-shielding portion) is not removed because this portion is not irradiated with the ultraviolet light L. In this embodiment, the first insulating layer is preferably made of a material with a low ultraviolet transmittance, such as silicon nitride and SiO.

As described above, the parts of the monomolecular film in the openings 24a can be removed by irradiation with the ultraviolet light L on the reverse side 20a of the substrate 20. In addition, the mask M used in the first embodiment is not required, thus allowing maskless ultraviolet irradiation.

(Method for Producing Organic EL Device According to Third Embodiment)

A method for producing an organic EL device according to a third embodiment of the present invention will now be described.

Only parts different from the above first embodiment are described below. The lyophobic film 26, which is formed by depositing a coupling agent by wet deposition in the first embodiment, is formed by depositing a resin material in this embodiment. In this embodiment, the same components are indicated by the same reference numerals to simplify the description below.

In a method for forming the lyophobic film 26 in this embodiment, a resin film for forming the lyophobic film 26 is first deposited on the overall surface of the substrate 20. This deposition is preferably performed by dip coating. An example of the material used in this method is a liquid material containing, for example, acrylic resin or polyimide resin. The resin used is either non-photosensitive or photosensitive resin. The thickness of the resin film is preferably not more than 1.5 times the total thickness of the hole-injection layers 70 and the luminescent layers 60 (the thickness of the light-emitting functional layers 22). In this embodiment, the thickness of the resin film is adjusted to about 0.1 µm.

The parts of the insulating film covering the openings 24a are then removed to form the lyophobic film 26.

If the material used for the lyophobic film 26 is a non-photosensitive resin material, the lyophobic film 26 can be formed according to the mask pattern used in photolithography. If, on the other hand, the material used is a photosensitive resin material, the lyophobic film 26 can be formed by development without the need for a step of applying a photoresist used in photolithography or an etching step.

The overall surface of the substrate 20 is subjected to $O_2$ plasma treatment and $CF_4$ plasma treatment. As a result, only the bare parts 23a of the pixel electrodes 23 attain lyophilicity while the other parts attain lyophobicity.

In this embodiment, as described above, the lyophobic film 26 may be made of a resin material. Even if a resin material is used for the lyophobic film 26, the same effect as in the first embodiment can be produced. In addition, the resin material may be treated with a lyophobic finish to provide the lyophobic film 26 with liquid-repellency.

The thickness of the lyophobic film 26 is not more than 1.5 times the total thickness of the hole-injection layers 70 and the luminescent layers 60. This reliably prevents the materials for the light-emitting functional layers 22 from creeping up the lyophobic film 26 and enhances the flattening of the light-emitting functional layers 22.

This method includes the step of applying a lyophilic finish and a lyophobic finish to provide the resin film with liquid-repellency and the pixel electrodes 23 with lyophilicity. As a result of the step, the liquid materials are not applied to the resin film, and can be allowed to wet and spread only over the pixel electrodes 23.

EXAMPLE

Figure 9:
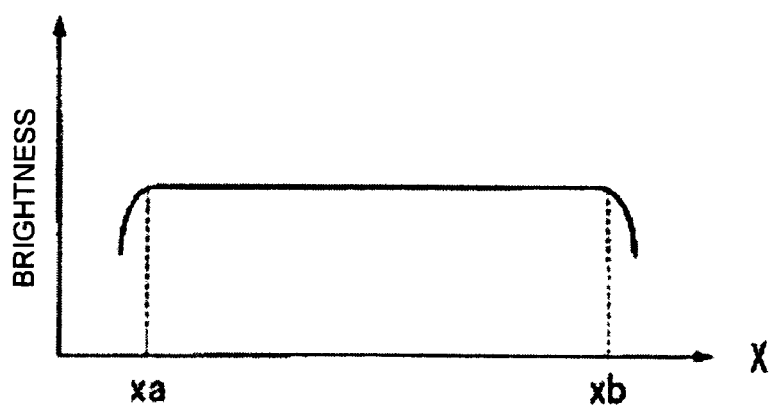
FIG. 9 illustrates the luminous characteristics of the organic EL device according to the present invention.

FIG. 9 is a graph showing the measurement results of the brightness distribution of the luminescent layer 60 shown in FIG. 7.

In FIG. 9, the horizontal axis indicates the position on the luminescent layer 60 in the X direction, the vertical axis indicates the brightness, and xa and xb correspond to positions xa and xb, respectively, on the luminescent layers 60 in FIG. 7.

FIG. 9 shows that the brightness distribution of the luminescent layer 60 is substantially uniform between xa and xb. In particular, it is obvious that the brightness distribution of the luminescent layer 60 is more uniform than those in the related art.

(Electronic Appliance)

Examples of electronic appliances equipped with an organic EL device according to the above embodiments will now be described.

Figure 10A:
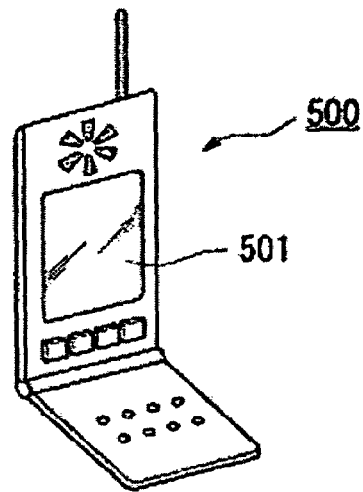
FIGS. 10A-10C illustrate electronic appliances equipped with the organic EL device according to the present invention.
Figure 10B:
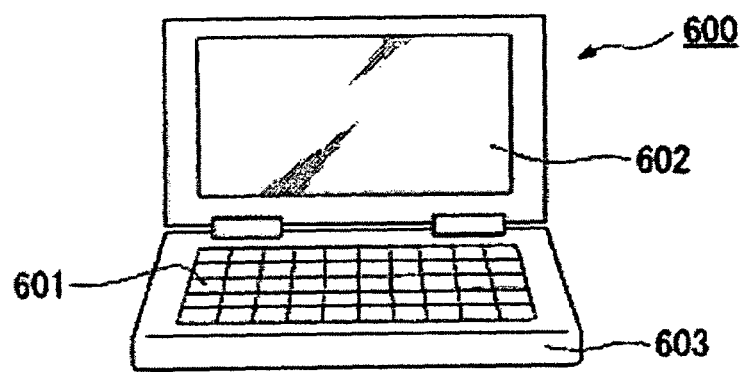
Figure 10C:
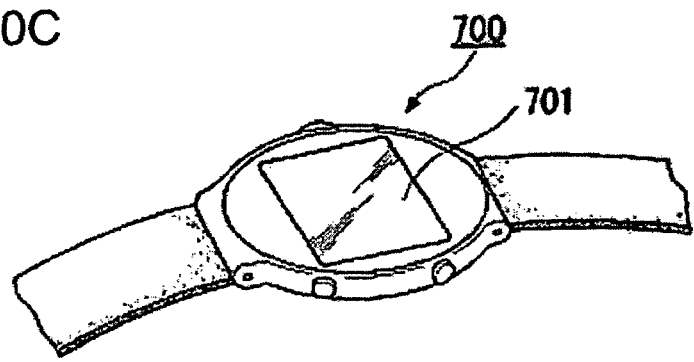
Figure 11A:
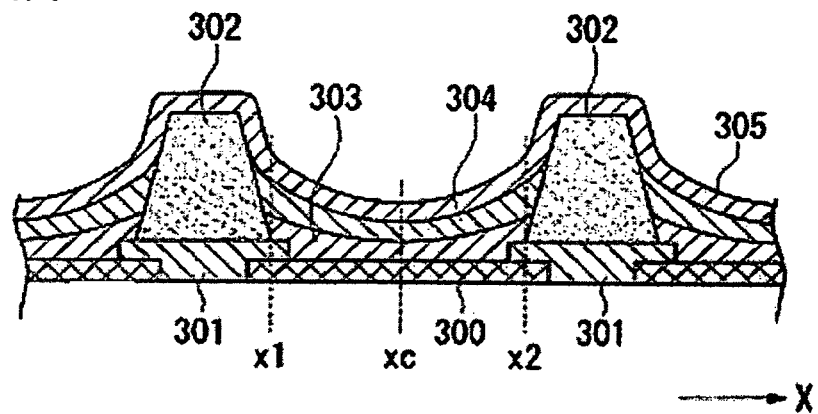
FIGS. 11A-11C show partial sectional views of a known organic EL device.
Figure 11B:
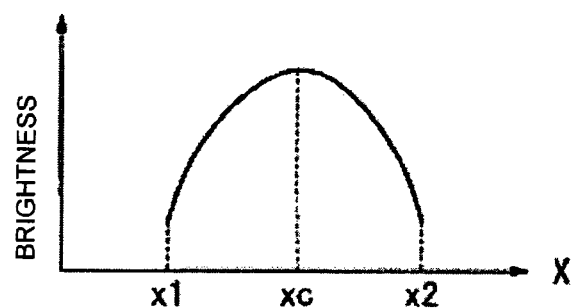
Figure 11C:
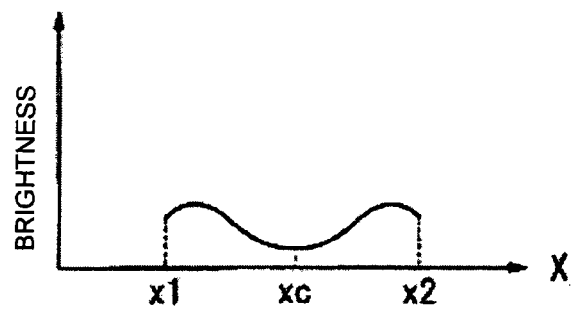

FIG. 10(*a*) is a perspective view of an example of a cellular phone. In FIG. 10(*a*), reference numeral 500 indicates a cellular phone, and reference numeral 501 indicates a display equipped with the organic EL device.

FIG. 10(*b*) is a perspective view of an example of a portable information processor such as a word processor and a personal computer. In FIG. 10(*b*), reference numeral 600 indicates an information processor, reference numeral 601 indicates an input device such as a key board, reference numeral 603 indicates a main body, and reference numeral 602 indicates a display equipped with the organic EL device.

FIG. 10(*c*) is a perspective view of an example of a wristwatch electronic appliance. In FIG. 10(*c*), reference numeral 700 indicates a wristwatch electronic appliance, and reference numeral 701 indicates an EL display equipped with the organic EL device.

The electronic appliances shown in FIGS. 10(*a*) to 10(*c*), having the organic EL devices according to the above embodiments, can attain good display characteristics.

The organic EL devices according to the above embodiments may also be applied to other various electronic appliances. Examples of such electronic appliances include desktop computers, liquid crystal projectors, multimedia-compatible personal computers (PCs) and engineering workstations (EWSs), pagers, word processors, televisions, camcorders with a viewfinder or monitor, electronic organizers, electronic desk calculators, car navigation systems, POS terminals, and devices with a touch panel.

What is claimed is:

1. An organic electroluminescent device comprising:
scanning lines;
signal lines;
switching elements formed corresponding to the intersections of the scanning lines and the signal lines;
light-emitting functional layers that emit light according to the operation of the switching elements, one of the light-emitting functional layers being disposed between a pixel electrode and a common electrode;
a first insulating layer formed between the light-emitting functional layers, the first insulating layer having an opening that overlaps the pixel electrode in plan view;
a second insulating layer formed between the light-emitting functional layers, the second insulating layer not being in contact with the light-emitting functional layers and the common electrode; and
a liquid repellent thin film covering the first and second insulating layers, the liquid repellent thin film being in a non-overlapping condition with the opening in plan view.

2. The organic electroluminescent device according to claim 1, further comprising drive elements for driving the light-emitting functional layers to emit light according to the operation of the switching elements,
wherein the position of the second insulating layer also corresponds to the positions of the drive elements.

3. The organic electroluminescent device according to claim 1, wherein the liqiuid repellent thin film is a monomolecular film.

4. The organic electroluminescent device according to claim 3, wherein the monomolecular film comprises a coupling agent.

5. The organic electroluminescent device according to claim 1, wherein the liqiuid repellent thin film is a resin film.

6. The organic electroluminescent device according to claim 5, wherein the surface of the resin film is treated with a lyophobic finish.

7. The organic electroluminescent device according to claim 1, wherein the thickness of the liqiuid repellent thin film is not more than 1.5 times the thickness of the light-emitting functional layers.

8. The organic electroluminescent device according to claim 1, wherein the liqiuid repellent thin film continuously covers the sides of the second insulating layer and the top of the first insulating layer.

9. The organic electroluminescent device according to claim 1, wherein the first insulating layer has openings in which electrodes are bare so that the electrodes come in contact with the light-emitting functional layers.

10. An electronic appliance comprising the organic electroluminescent device according to claim 1.

11. A method for producing an organic electroluminescent device comprising the steps of:
forming scanning lines and signal lines above a substrate,
forming switching elements formed corresponding to intersections of the scanning lines and the signal lines,
forming light-emitting functional layers that emit light according to the operation of the switching elements, one of the light-emitting functional layers being disposed between a pixel electrode and a common electrode,
forming a first insulating layer formed between the light-emitting functional layers, the first insulating layer having an opening that overlaps the pixel electrode in plan view,
forming a second insulating layer between the light-emitting functional layers, the second insulating layer in a position out of contact with the light-emitting functional layers and the common electrode, and
forming a liquid repellent thin film so as to cover the first and second insulating layers, the liquid repellent thin film being in a non-overlapping condition with the opening in plan view.

12. The method for producing the organic electroluminescent device according to claim 11, forming the liquid repellent thin film includes:
forming a monomolecular film on the overall surface of the substrate by applying a liquid material containing the material for the monomolecular film; and
partially removing the monomolecular film so that electrodes are bare.

13. The method for producing the organic electroluminescent device according to claim 12, partially removing the monomolecular film so that the electrodes are bare being performed by irradiating the monomolecular film with ultraviolet light through a mask having a light-shielding portion and light-transmitting portions.

14. The method for producing the organic electroluminescent device according to claim 12, partially removing the monomolecular film so that the electrodes are bare being performed by irradiating the monomolecular film with ultraviolet light through the substrate, which has a light-shielding portion and light-transmitting portions.

15. The method for producing the organic electroluminescent device according to claim 11, forming the liquid repellent thin film includes:

forming a resin film on the overall surface of the substrate by applying a liquid material containing a resin material;

partially removing the resin film so that electrodes are bare; and applying a lyophilic finish and a lyophobic finish.

* * * * *